(12) United States Patent
Okada et al.

(10) Patent No.: US 6,693,448 B1
(45) Date of Patent: Feb. 17, 2004

(54) SEMICONDUCTOR INTEGRATED CIRCUIT

(75) Inventors: Hidehiro Okada, Tokyo (JP); Tetsuya Maruyama, Ome (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 09/763,495

(22) PCT Filed: Jul. 30, 1999

(86) PCT No.: PCT/JP99/04106

§ 371 (c)(1),
(2), (4) Date: Feb. 23, 2001

(87) PCT Pub. No.: WO00/11486

PCT Pub. Date: Mar. 2, 2000

(30) Foreign Application Priority Data

Aug. 24, 1998 (JP) .......................................... 10-237392

(51) Int. Cl.[7] .............................................. G01R 31/26
(52) U.S. Cl. ..................................... 324/765; 324/158.1
(58) Field of Search ............................. 324/765, 158.1; 714/724, 733; 365/189.05, 734

(56) References Cited

U.S. PATENT DOCUMENTS

| 5,097,206 A | 3/1992 | Perner | |
| 5,592,494 A | * 1/1997 | Nozuyama | 714/733 |
| 6,101,623 A | * 8/2000 | Nozuyama | 714/733 |
| 6,144,214 A | * 11/2000 | Athan | 324/763 |
| 6,151,694 A | * 11/2000 | Nozuyama | 714/724 |

FOREIGN PATENT DOCUMENTS

| JP | 03120859 | 5/1991 |
| JP | 04290975 | 10/1992 |
| JP | 05326870 | 12/1993 |
| JP | 07037956 | 2/1995 |
| JP | 09101347 | 4/1997 |

* cited by examiner

Primary Examiner—Kamand Cuneo
Assistant Examiner—Tung X. Nguyen
(74) Attorney, Agent, or Firm—Antonelli, Terry, Stout & Kraus, LLP

(57) ABSTRACT

A semiconductor integrated circuit is segmented into a plurality of blocks. Each block includes a switching transistor which is connected between the CMOS circuit of the block and the ground point and is adapted to shut off the current of the CMOS circuit by being controlled by a test mode control signal, and a leakage current detecting circuit which has a self-check function for the block. A signal which is the logical sum of the outputs of the leakage current detecting circuits of all blocks is led out of the semiconductor integrated circuit through a common external output terminal.

13 Claims, 9 Drawing Sheets

SEMICONDUCTOR INTEGRATED CIRCUIT

Technical Field

The present invention relates to the technology of semiconductor integrated circuit, and particularly to a technique which is applied effectively to the measurement of leak current of a semiconductor integrated circuit, and more particularly to a technique which is useful for the measurement of leak current of a CMOS integrated circuit.

BACKGROUND ART

For the detection of short-circuiting or breakdown of the pn junction of a semiconductor integrated circuit and the detection of breakdown of the gate insulation film of MOSFET, a leak current which is caused by these events is measured. A CMOS circuit has no or very small load current in its inactive state, and accordingly the presence or absence of a leak current can be determined by applying a power voltage and measuring the load current.

However, due to the trend of the higher circuit integration, the lower threshold signal level and the higher chip temperature resulting from the lower operating voltage, the load current of MOSFET in the inactive state increases, making it difficult to discriminate a leak current, and consequently it becomes difficult to measure the leak current accurately by the conventional manner based on the power voltage application and load current measurement.

Japanese Patent Unexamined Publication No.Hei 9 (1997)-101347 describes an invention which resembles and precedes the present invention. FIG. 11 shows the representative of the embodiments of this preceding invention, which is intended to find a circuit having a leak current based on the circuit arrangement as follows. The internal circuit is segmented into multiple blocks, and the blocks (inner circuits 01–05) are provided on their power voltage $V_{DD}$ side with switching MOSFETs S1–S5 which can be turned on or off selectively by the control signals received on the external terminals (pads) P1–P5. The blocks (inner circuits 01–05) are further provided on their ground voltage GND side with a leak current lead-out circuit 21, which is formed of a transistor 27 and a current mirror circuit (29,31), for shutting off the load current of the inner circuits at the detection of leak current. The circuit arrangement includes a leak current detecting circuit which is formed of a reference current generation circuit 17 connected in series to one transistor of the current mirror circuit and an inverter 19 which is adapted to compare the leak current flowing through the leak current lead-out circuit 21 with the reference current provided by the reference current generation circuit 17.

Although this preceding invention is capable of finding a circuit having a leak current, this "tandem circuit arrangement" having the MOS transistors connected on the power voltage $V_{DD}$ side and ground voltage GND side makes the supply oltage of the inner circuits lower than the power voltage on the chip terminal. On the other hand, a power voltage at a certain voltage level or higher is needed for the normal operation of the inner circuits. On this account, the circuit arrangement of this preceding invention cannot be fully adaptive to the trend of lower power voltage of semiconductor integrated circuits. Moreover, if the reference current generation circuit 17 or inverter 19 used in the leak current lead-out circuit and leak current detecting circuit fails, a leak current cannot be detected or will be detected erroneously.

Although this preceding invention also shows an embodiment (FIG. 11 of the above-mentioned patent publication) including a leak current detecting circuit for each segmented inner circuit, the leak current detecting circuit having two MOS transistors in tandem connection (FIG. 12 of the above-mentioned patent publication) cannot be fully adaptive to the trend of lower power voltage of semiconductor integrated circuits.

It is an object of the present invention to provide a technique of semiconductor integrated circuit capable of detecting easily and accurately the presence or absence of a leak current in excess of the specified amount in a CMOS integrated circuit chip.

Another object of the present invention is to provide a technique of semiconductor integrated circuit capable of detecting a leak current even in the case of low-voltage design.

Still another object of the present invention is to provide a technique of semiconductor integrated circuit capable of detecting the abnormality of the leak current detecting circuit.

These and other objects and novel features of the present invention will become apparent from the following description of specification taken in conjunction with the accompanying drawings.

DISCLOSURE OF THE INVENTION

Among the affairs of the present invention disclosed in this specification, presentatives are summarized as follows.

A semiconductor integrated circuit is segmented into multiple blocks, and each block is provided between the CMOS circuit and one (e.g., ground point) of at least two potential points (power voltage $V_{DD}$ and ground potential) with a switching transistor which can be controlled by a test mode control signal to shut off the current flowing through the CMOS circuit and also provided with a leak current detecting circuit, with a signal resulting from the logical sum of the outputs of all leak current detecting circuits being led out of the semiconductor integrated circuit through an external output terminal common to all blocks. The leak current detecting circuit has its arrangement devised as follows so that it can implement the detection of abnormality of the leak current detecting circuit itself (self check) and the output of detection result.

The leak current detecting circuit with the ability of self check is conceivably a combined circuit including a switching circuit which can connect the circuit in the block to a common constant current source, a potential detecting circuit which is formed of an inverter and the like and designed to detect the potential of an arbitrary node on the current path of the constant current source and have its output varied in response to a leak current larger than a certain value, a means of supplying a pseudo leak current to the constant current source, and a current path switching means which is connected to the output terminal of the potential detecting circuit and adapted to switch between the pulling and pushing of a current from/to the output terminal depending on the control mode.

The above-mentioned means can detect easily and accurately as to whether or not a leak current more than a specified amount is flowing through the CMOS integrated circuit by merely checking a specific external output terminal. Based on the design of leading out the signal resulting from the logical sum of the outputs of leak current detecting circuits of all blocks through the common external output terminal, the increase in the number of external terminals can be minimized.

Based on the provision of the switching transistor connected between the CMOS circuit of each block and one potential point (e.g., ground point) so as to shut off the current flowing through the CMOS circuit by being controlled by the test mode control signal, the number of transistors in tandem connection in each block can be reduced, which is advantageous in being adaptive to the trend of lower power voltage of semiconductor integrated circuits.

An alternative design, instead of leading out the signal resulting from the logical sum of the outputs of all leak current detecting circuits through the common external output terminal, is to provide a selector circuit between the output terminals all leak current detecting circuits and the common external output terminal so that the detect signal of each leak current detecting circuit is led out selectively. This arrangement, which can determine a block having a leak current, is advantageous in facilitating the fault analysis.

Based on the provision of the means of pseudo leak current supply to the constant current source and the current path switching means which switches between the pulling and pushing of a current from/to the output terminal of the potential detecting circuit depending on the control mode, it becomes possible to detect the abnormality of the leak current detecting circuit itself and/or the low-stuck fault (fixed to the ground voltage) of the wiring for the logical sum of the leak current detecting circuits and of the output terminal.

BEST MODE FOR CARRYING OUT THE INVENTION

Preferred embodiments of the present invention will be explained with reference to the drawings.

Figure 1:
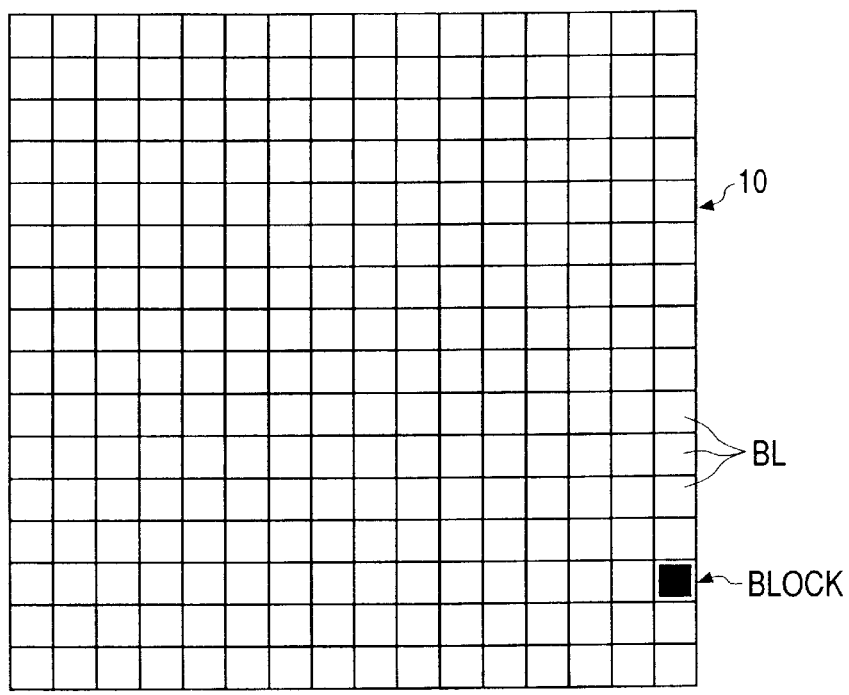
FIG. 1 is a conceptual diagram showing the arrangement of the whole LSI chip as a first embodiment of CMOS-LSI based on the present invention.
Figure 2:
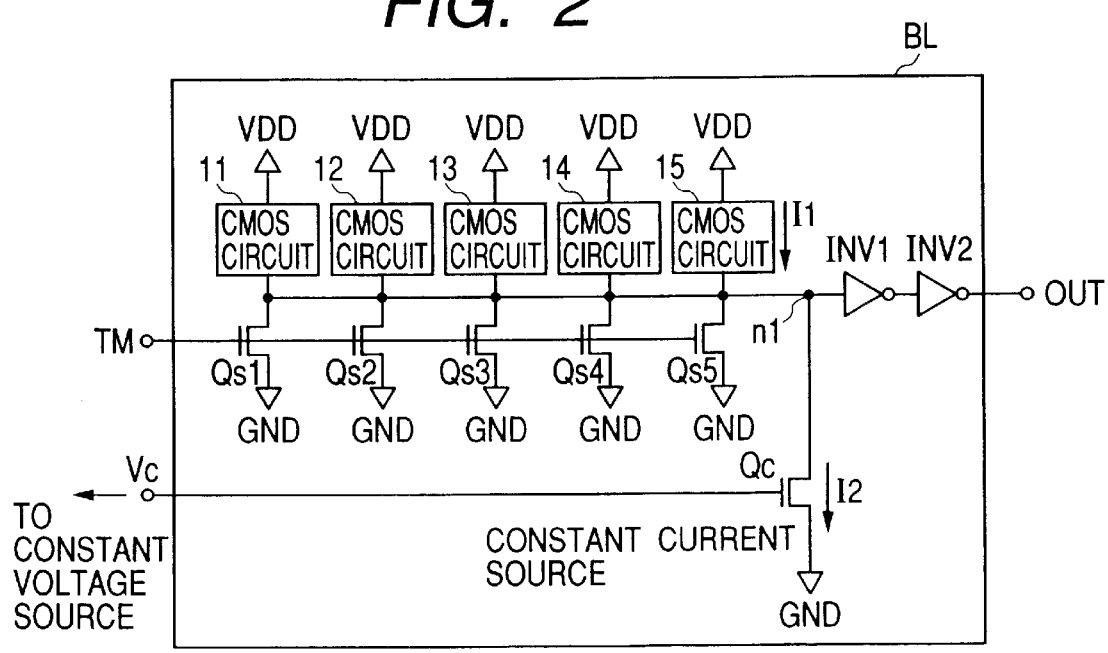
FIG. 2 is a block diagram showing an embodiment of the leak current detecting circuit in each segment block.
Figure 3:
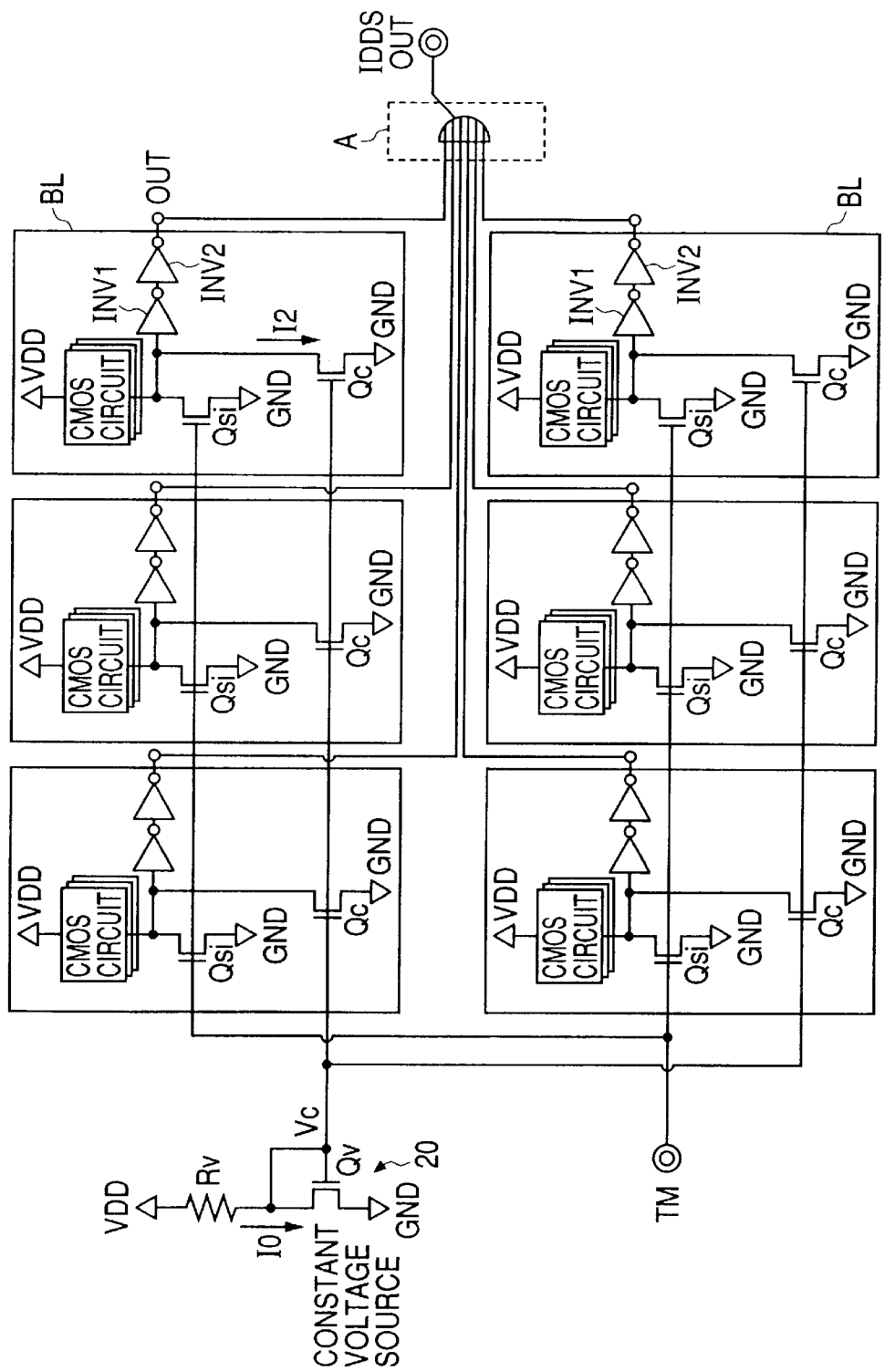
FIG. 3 is a block diagram showing an example of the relation between the leak current detecting circuits in the segment blocks and the external output terminal.

FIG. 1 through FIG. 3 show the first embodiment of CMOS-LSI, with the present invention being applied thereto. An entire LSI chip 10 is segmented into multiple blocks BL as shown in FIG. 1. Each segment block is arranged as shown in FIG. 2. FIG. 3 shows the relation among the segment blocks. Although FIG. 1 shows even segmentation of the inside of LSI to yield the segment blocks BL of the same size, it is not necessary for all blocks to have the same size. Instead, the inside of LSI may be divided into functional blocks.

The manner of segmentation into functional blocks may be either dividing into large blocks or small blocks. As a manner of division into large blocks, a system LSI, for example, is divided into a CPU (central processing unit), a memory circuit such as ROM (read-only memory) and RAM (random access memory), an arithmetic unit for high-level arithmetic operations such as multiplication, a DMA controller, an interrupt controller, an analog-to-digital conversion circuit, a serial communication interface circuit, and a timer circuit.

A manner of division into small functional blocks can be division into registers, counters, operation circuits for simple calculations such as addition and subtraction, selector circuits, multiplexers, and decoders. In the case of division into large blocks, each functional block may be assumed to be a CMOS circuit shown in FIG. 2 and provided with a leak current detecting circuit.

For minimizing the increase of occupying area, it is desirable to make each block of as large circuit as possible provided that a leak current can be detected depending on the arrangement and operation of the detecting circuit to be adopted. From the viewpoint of the easiness of design of the leak current detecting circuit, segmentation is designed so that leak currents are virtually equal among all blocks.

Next, the arrangement of one segment block resulting from the division in a proper size as described above will be explained in connection with FIG. 2. In FIG. 2, reference numerals 11 through 15 denote CMOS circuits which are made up of p-channel MOSFETs and n-channel MOSFETs in serial connection to form logic function blocks such as NOR gates, AND gates, inverters and latch circuits, and are designed to have virtually no load current when their input signals are unchanged. Usually, the CMOS circuits have their power terminals connected to the power voltage $V_{DD}$ and ground point GND, whereas in this embodiment of invention, there are connected, between the CMOS circuits 11–15 and the ground point GND, current shut-off switching MOSFETs Qs1–Qs5 which receive a test mode control signal TM on their gate terminals. In this specification, MOSFET signifies generically an electric-field effect transistor of the insulated gate type.

These MOSFETs Qs1–Qs5 have their drains connected to a common MOSFET Qc. The MOSFET Qc operates as a constant current source by being supplied on its gate terminal with a constant voltage Vc from a constant voltage source. The constant current sourcing MOSFET Qc has a current capacity greater than the allowable leak current of the CMOS circuits 11–15.

Connected at the node n1 of the MOSFETs Qs1–Qs5 and the constant current sourcing MOSFET Qc is the input terminal of an inverter INV1, which is connected in series at its output terminal to another inverter INV2. The switching MOSFETs Qs1–Qs5, constant current sourcing MOSFET Qc, and inverters INV1 and INV2 in unison constitute a leak current detecting circuit.

In this embodiment, the constant current sourcing MOSFET Qc has its gate width adjusted thereby to determine the current I2 flowing through the CMOS circuits 11–15 of the block and the inverter INV1 has its threshold level adjusted so that its output has the low level when the load current I1 of the whole block is more than a certain value on condition that the switching MOSFETs Qs1–Qs5 are off and the input signals of the CMOS circuits 11–15 are unchanged.

A manner of making the input signals of the CMOS circuits 11–15 unchanged is to pull the input terminals or common input/output terminals of the LSI to the power voltage or ground voltage, for example. Another manner for the LSI having an external operation clock signal is to gate out the clock input.

In this embodiment, the inverter INV2 has the low-level output when the leak current of the whole block is smaller than a certain value, and the output turns to the high level when the leak current is larger than the certain value. Accordingly, the presence or absence of a leak current can be known easily by checking the output of the inverter INV2. In addition, by designing the gate width of the constant current sourcing MOSFET Qc independently for each block depending on its allowable leak current, it becomes possible to set a leak current depending on the size of block.

In this embodiment, a constant voltage source 20 which provides the bias voltage Vc for the constant current sourcing MOSFET Qc of each block is made up of a MOSFET Qv in diode connection having its gate and drain connected together and a resistor Rv connected on the drain side of Qv as shown in FIG. 3, and the constant current sourcing MOSFET Qc provided in each block is in current mirror connection with MOSFET Qv of the constant voltage source 20.

Accordingly, by setting the ratio n of the gate widths of Qc and Qv appropriately, the constant current sourcing MOSFET Qc can have a current that is n times the current IO flowing through the MOSFET Qv of the constant voltage source 20. In consequence, by adjusting the gate width of the constant current sourcing MOSFET Qc of each block, it is possible to set a threshold leak current depending on the size of each block. Otherwise, block division may be designed so that threshold leak currents are virtually equal among all blocks, in which case the leak current detecting circuits of all blocks can have an equal sensitivity.

In this embodiment, as shown in FIG. 3, the outputs of the inverters INV2 of all blocks in the LSI are connected to produce a wired-OR logic output and the resulting signal is led out through the external output terminal IDDSOUT. Accordingly, by measuring the signal on the IDDSOUT terminal, while turning off the switching MOSFETs Qsi in all blocks by the control signal TM, it is possible to detect the presence of leak current in one block.

Generally, a product of semiconductor integrated circuit having a leak current in one segment is judged to be a faulty product at the product selection test, and therefore there is no problem in the arrangement of leading out the signal of wired-OR logic of the outputs of the inverters in all blocks through a common external output terminal IDDSOUT, and it is rather advantageous in the reduction of the number of external terminals based on the common terminal for the output of the detection result. Moreover, this embodiment uses a common external terminal for the input of the test mode control signal and a common constant voltage source 20 for driving the constant current sourcing MOSFETs Qc, which is advantageous in the prevention of the increase of chip size.

This embodiment is designed to form the constant voltage source 20 inside the same chip, and it is supplied with the power voltage $V_{DD}$ only in the test mode set by the test mode control signal TM for leak current detection.

An alternative arrangement is providing a selector circuit in the section of FIG. 3 enclosed by the dashed line A. The selector circuit is controlled to lead out the results of leak current detection (outputs of the inverters INV2) of all blocks sequentially, thereby indicating a block having a leak current. This is a useful function for the analysis of LSI fault.

Figure 4:
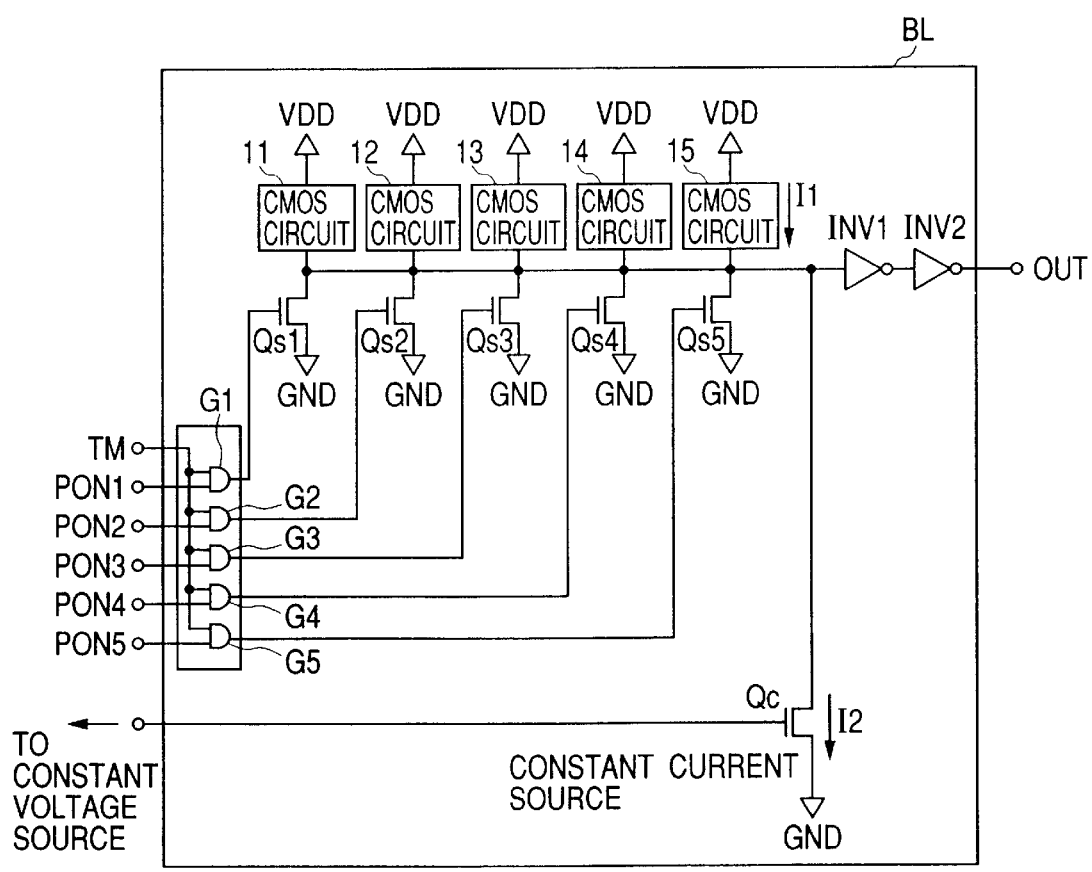
FIG. 4 is a block diagram showing a variant of the embodiment of FIG. 2.

FIG. 4 shows a variant of the embodiment of FIG. 2.

This embodiment is derived from the embodiment of FIG. 2, with alteration being that instead of applying the test mode control signal TM directly to the gate terminals of the switching MOSFETs Qs1–Qs5 which are provided between the CMOS circuits 11–15 and the ground potential to shut off the currents of the CMOS circuits at testing, the gate terminals have the application of the output signals of AND gates G1–G5 which take logical product between the test mode control signal TM and operation control signals PON1–PON5. The operation control signals PON1–PON5 may be supplied from the outside of the chip through external terminals (pads), or produced and supplied by other functional block within the chip, or supplied from a register which is provided for controlling the MOSFETs Qs1–Qs5.

In this embodiment, when the test mode control signal TM becomes the low level at the leak current detection test, all AND gates G1–G5 produce the low-level outputs to trun off all switching MOSFETs Qs1–Qs5. Consequently, it becomes possible to carry out the same leak current test as that of the embodiment of FIG. 2.

At the normal operation, in which the test mode control signal TM has the high level, operation control signals PON1–PON5 turn off corresponding switching MOSFETs Qs1–Qs5 of CMOS circuits 11–15 to shut off their operating currents, thereby halting the operation of the circuits selectively. Accordingly, this embodiment is applied effectively to the case with the intention of saving the power consumption by halting the operation of some CMOS circuits in a system LSI or the like having a standby mode. This arrangement enables the reduction of power consumption of the LSI and the reduction of the circuit occupancy area thereby to minimize the increase of chip size as compared with the case of providing the current shut-off switches of the leak current detecting circuits separately for all circuits.

This embodiment is also useful for LSI which is designed to replace the memory array having defects with a spare memory array with the intention of enhancing the yield of products, in which case the memory array in which defects are found is deactivated by shutting off the current.

Figure 5:
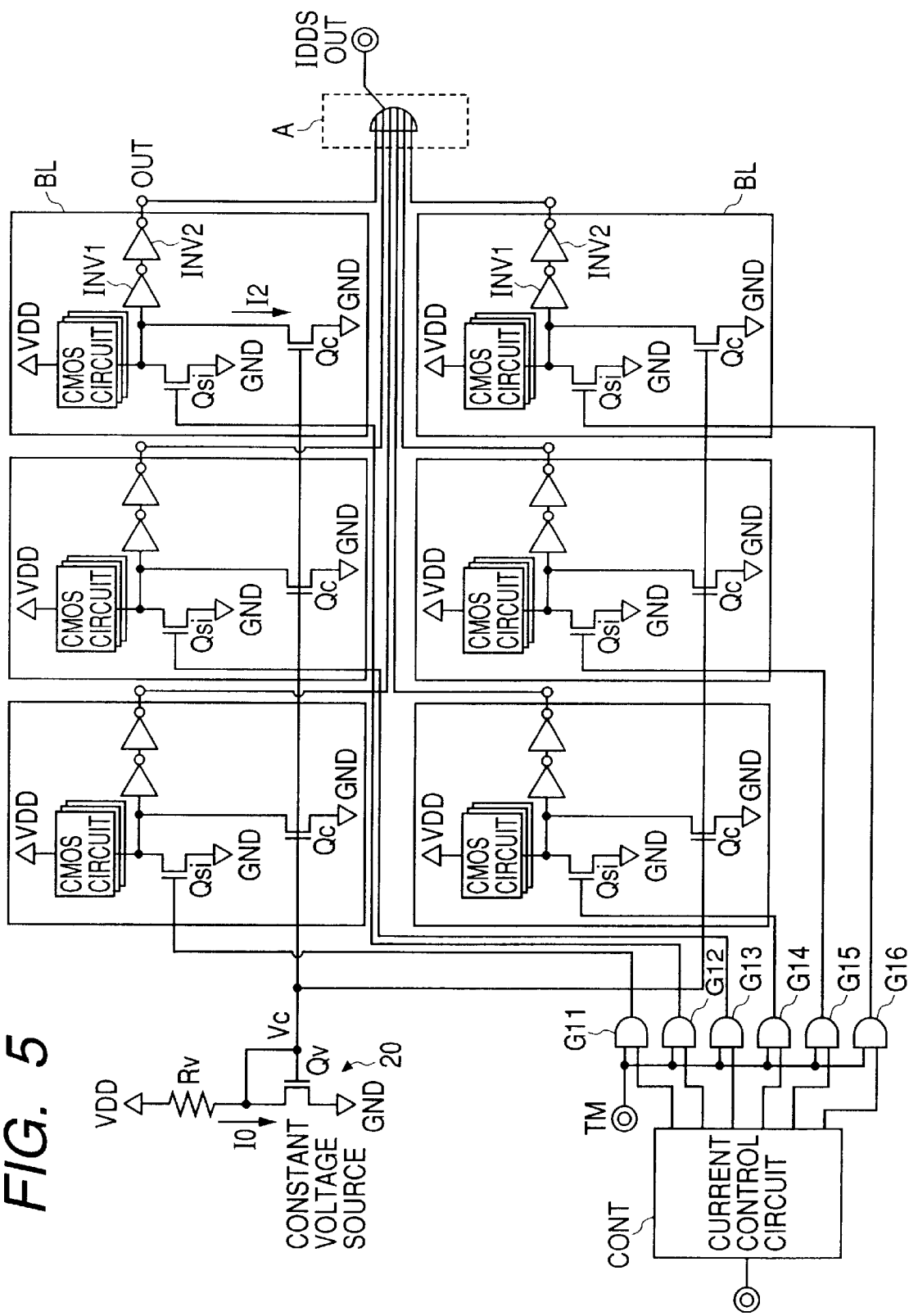
FIG. 5 is a block diagram showing a variant, in the same sense as FIG. 4, of the embodiment of FIG. 3.

FIG. 5 shows an example which is another variant derived from the embodiment of FIG. 3 and is similar to the embodiment of FIG. 4.

This embodiment is designed to alter the direct application of the test mode control signal TM to the gate terminals of the switching MOSFETs Qsi which are provided for all functional blocks in the embodiment of FIG. 3 for shutting off the block currents at the time of testing, and instead, apply to the gate terminals the output signals of AND gates G11–G16 which take logical product between the test mode control signal TM and control signals provided by a current control circuit CONT. This embodiment, as in the case of the embodiment of FIG. 4, can save the power consumption by shutting off the block current on a block-by-block basis in the standby mode or the like.

The current control circuit CONT is formed of a register which belongs to other functional block within the chip and has its content set through an external terminal (pad) of the chip, or a decoder or the like which decodes a selection signal supplied from the outside of the chip.

Figure 6:
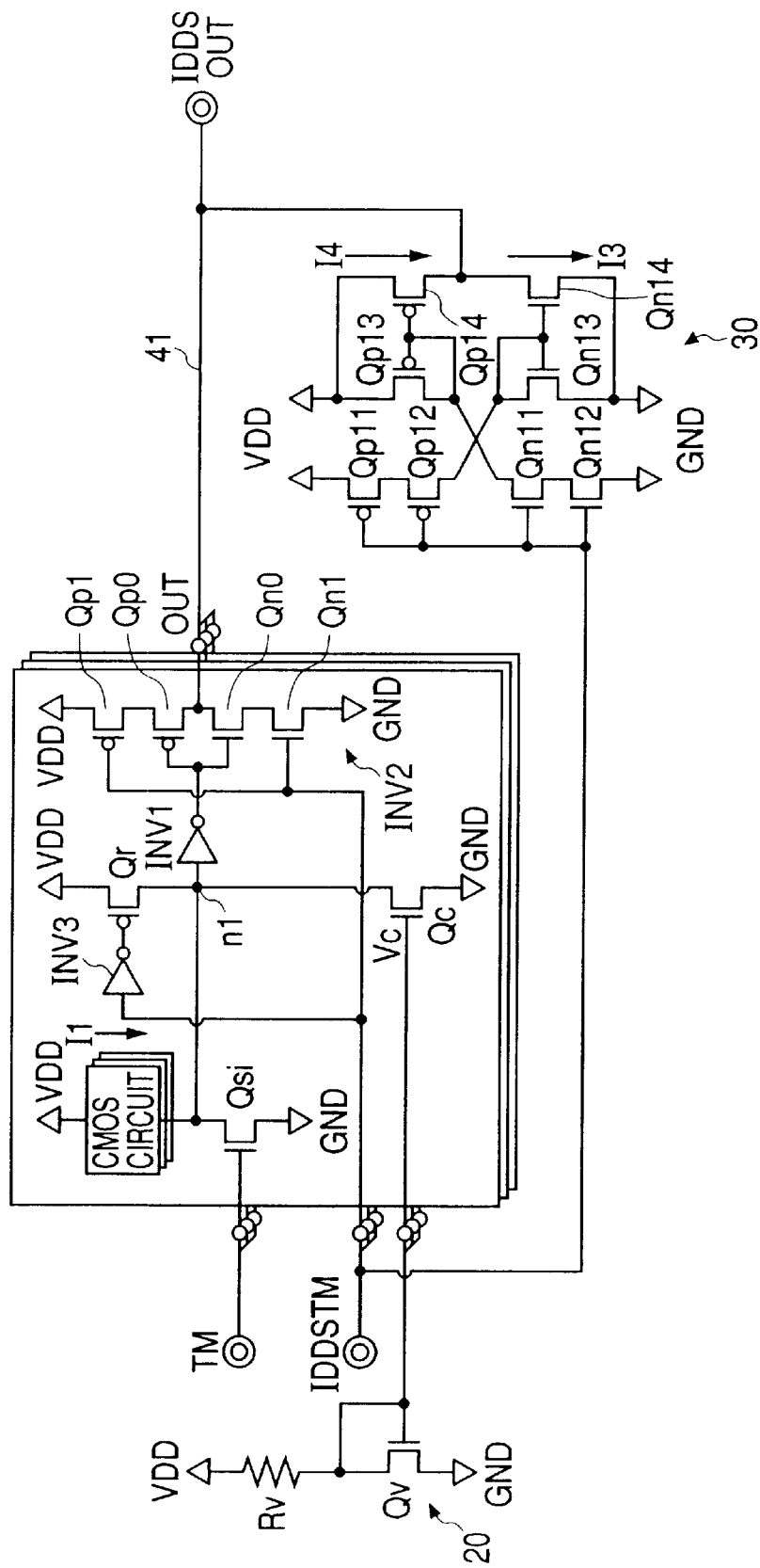
FIG. 6 is a block diagram showing another embodiment of the leak current detecting circuit in the block.

FIG. 6 shows an embodiment with an additional self-check circuit which verifies the normality of the function of leak current detecting circuit of the preceding embodiment provided for each block. In FIG. 6, MOSFETs, with a symbol of small circle being attached to their gate, are of the p-channel type and those without this symbol are of the n-channel type.

In this embodiment, a MOSFET Qr which is adapted to conduct a pseudo leak current is connected between the node n1, at which the leak current detecting inverter INV1 detects the potential, and the power voltage $V_{DD}$ in each block. The output inverter INV2 is designed to be of the clocked-inverter type, and MOSFETs Qp1 and Qn1 for controlling this inverter have their gate terminals supplied with a control signal IDDSTM which turns the leak current detecting circuit to the function test mode. An inverted version of the control signal IDDSTM produced by another inverter INV3 is applied to the gate terminal of the pseudo leak current conducting MOSFET Qr.

This embodiment further includes a current path switching circuit 30, which is connected commonly to the output terminals OUT of the leak current detecting circuits of the multiple blocks. The current path switching circuit 30 is made up of p-channel MOSFETs Qp11 and Qp12 in serial connection having the application of the control signal IDDSTM on their gate terminals, n-channel MOSFETs Qn11 and Qn12 in serial connection, an n-channel MOSFET Qn13 connected in series to the Qp12, a p-channel MOSFET Qp13 connected in series to the Qn12, a p-channel MOSFET Qp14 in current-mirror connection with the Qp13, and an n-channel MOSFET Qn14 in current-mirror connection with the Qn13.

The current flowing through the pseudo leak current conducting MOSFET Qr is designed to be larger than the current flowing through the constant current sourcing MOSFET Qc, although this affair is not compulsory. The current flowing through the constant current sourcing MOSFET Qc is designed to be larger than the allowable leak current I1 of the CMOS circuit.

Figure 7:
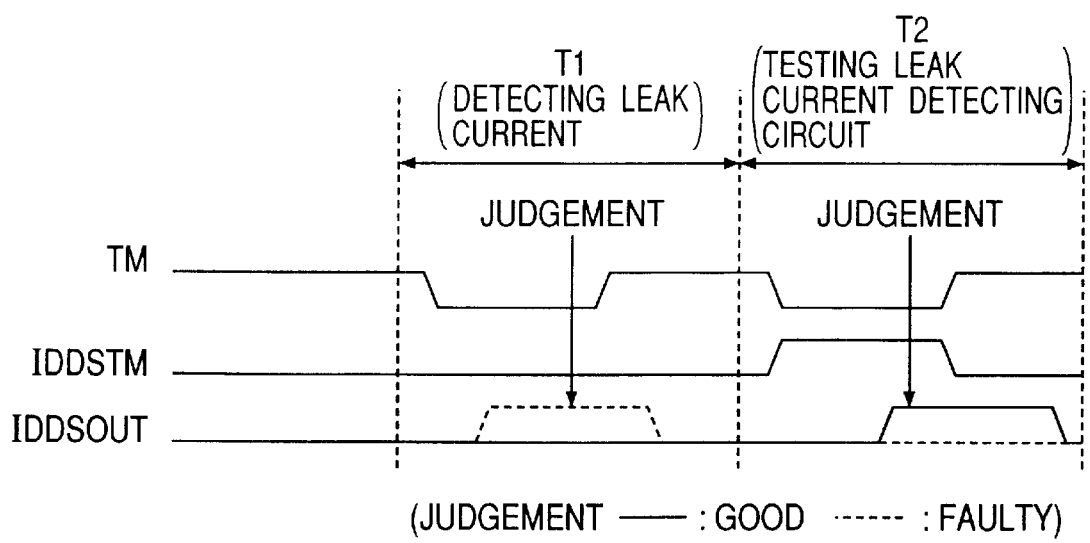
FIG. 7 is a timing chart showing the control timing of the leak current detecting circuit of the embodiment of FIG. 6.

In the circuit of this embodiment, when the control signal TM is brought to the low level in the state of a low-level control signal IDDSTM as shown in T1 in FIG. 7, the MOSFETs Qr and Qsi turn off, causing the leak current I1 of the CMOS circuits 11–15 to flow through the constant current sourcing MOSFET Qc. At this time, in the current path switching circuit 30 having a low-level control signal IDDSTM, the MOSFETs Qn11 and Qn12 are in the off state and the Qp11 and Qp12 are in the on state. Consequently, a current I3 flows through the MOSFETs Qn13 and Qn14 which are connected to the Qp11 and Qp12, and the output terminal IDDSOUT is normally pulled to the low level.

If a leak current I1 in excess of a certain amount flows in the CMOS circuit 11–15, causing the potential at the node n1 to rise over a certain level, the inverter INV1 turns its output to the low level. At this time, the MOSFET Qpi is on due to the control signal IDDSTM, causing the inverter INV2 to produce a high-level output, resulting in a virtually the same operation as the leak current detecting circuit of the embodiment of FIG. 2.

In the circuit of this embodiment, on the other hand, when the control signal TM is brought to the low level in the state of a higt-level control signal IDDSTM as shown in T2 in FIG. 7, the MOSFETs Qr and Qni turn on and the Qsi and Qp1 turn off, causing a pseudo leak current to flow from the MOSFET Qr to the constant current sourcing MOSFET Qc even in the absence of a leak current I1 in the CMOS circuits 11–15. At this time, in the current path switching circuit 30 having a high-level control signal IDDSTM, the MOSFETs Qn11 and Qn12 are in the on state and the Qp11 and Qp12 are in the off state. Consequently, a current I3 flows through the MOSFETs Qp13 and Qp14 which are connected to the Qn11 and Qn12, and the current I3 is shut off.

If the leak current detecting circuit is normal, the inverter INV1 produces a low-level output in response to a leak current of all blocks in excess of a certain amount, causing the MOSFETs Qp0 and Qn0 to turn on and off, respectively, in the inverter INV2. Since the MOSFET Qp1 of the inverter INV2 is off then due to the control signal IDDSTM as mentioned previously, the inverter INV2 has its output node becoming a high-impedance state. Consequently, the output terminal IDDSOUT is brought to the high-level by the current I4 of the current path switching circuit 30.

Otherwise, if a wire 41 between the output node of the inverter INV2 and the output terminal IDDSOUT is short-circuited to the ground potential, the current I4 of the current path switching circuit 30 flows to the ground potential through the point of short-circuit. Accordingly, the output terminal IDDSOUT does not become the high level, which is detected from the outside by checking this terminal to determine the leak current detecting circuit to be faulty (low-stuck fault).

In the case of a fault where the inverter INV1 stays at a high-level output (output high-stuck fault), the inverter INV2 has its MOSFET Qn0 turned on. At this time, the MOSFET Qn1 is on due to the control signal IDDSTM, causing the current I4 flowing out of the current path switching circuit 30 to flow to the n-channel MOSFETs of the inverter INV2. Consequently, the output terminal IDDSOUT does not become the high level, which is detected in the same manner as the output terminal low-stuck fault described above.

Furthermore, the inverter INV1 has a high-level output at the time of testing when the gate terminal of the MOSFET Qsi which shuts off the block current is short-circuited to the power voltage $V_{DD}$, i.e., high-stuck fault, or when the input terminal of the inverter INV1 is short-circuited to the ground potential, i.e., low-stuck fault, causing the output terminal IDDSOUT to stay at the low level, and these faults can be detected in the same manner as the output high-stuck fault of the inverter INV1.

In this manner, this embodiment can detect most faults of the leak current detecting circuit based on the provision of the pseudo leak current conducting MOSFET Qr and current path switching circuit 30.

However, the foregoing arrangement is not capable of detecting the breakage, i.e., open fault, of the wire 41 which connects the output node of the inverter INV2 to the output terminal IDDSOUT, and a fault of the current path switching circuit 30. These faults, however, can be reduced to the extent of negligible probability of occurrence by the provision of a plurality of the inverter INV2, current path switching circuit 30 and output terminal IDDSOUT for each block. Providing multiple sets of these circuits results in an extremely small probability of faults of all circuit sets and enables the detection of a fault of the leak current detecting circuit based on at least one normal circuit set.

Figure 8:
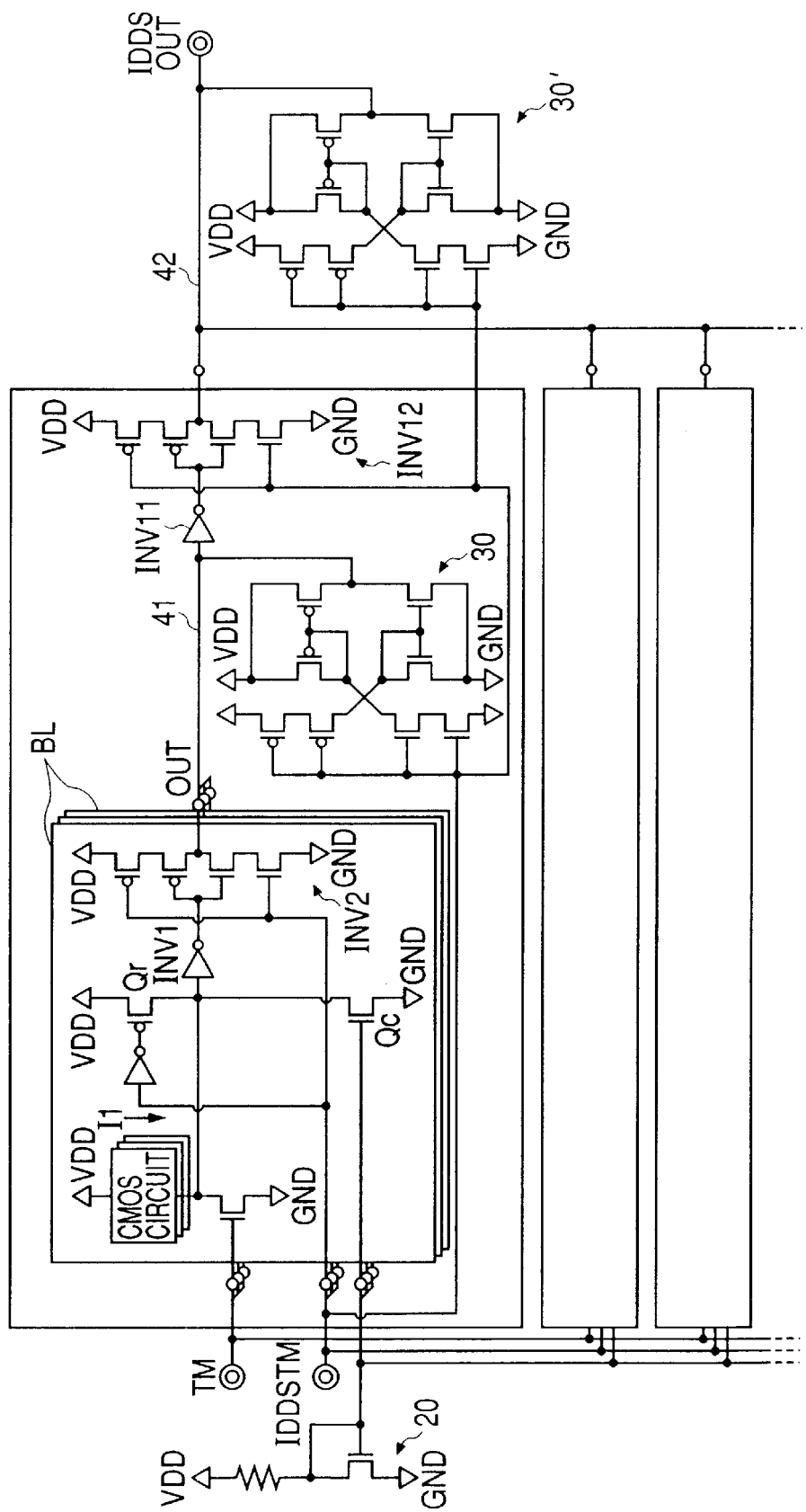
FIG. 8 is a block diagram showing another embodiment of CMOS-LSI based on the present invention.

FIG. 8 shows another embodiment of CMOS-LSI, with the present invention being applied thereto. This embodiment is an advanced version of the embodiment of FIG. 6 and is particularly useful for large-scale CMOS-LSIs having gates of several hundred thousands or more. In the case of arrangement in which the detect signals from leak current detecting circuits of all functional blocks are sent to the common detection result output terminal IDDSOUT, the average distance of signal lines from the functional blocks to the output terminal and the number of signal lines increase in proportion to the number of functional blocks of a huge LSI. The above-mentioned wired-OR logic of the output nodes increases the load to the output inverter INV2, resulting unfavorably in a slower detection speed.

For coping with this matter, there is devised a buffer formed of several stages of inverters on the output signal route from the leak current detecting circuits to the output terminal IDDSOUT. However, an increased number of inverters will impose a problem of a fault of inverter itself. This embodiment is designed to include inverters INV11 and INV12 for the buffer and a current path switching circuit 30 on the output signal route for each group of several functional blocks in the LSI, and further include a common current path switching circuit 30' provided for a plurality of the INV11 and INV12 for the buffer so as to build a hierarchical self check circuit, thereby enhancing the detection speed.

Also in this embodiment, as for the inverter INV2 of the embodiment of FIG. 6, the rear-stage buffering inverter INV11 is a clocked inverter having control MOSFETs Qp11 and Qn11, with the test mode control signal IDDSTM being applies to the gate terminals of the MOSFETs Qp11 and Qn11.

The checking function of the current path switching circuit 30' of this embodiment for the buffering inverters INV11 and INV12 and the wire 42 to the output terminal IDDSOUT is identical to the checking function of the current path switching circuit 30 for the leak current detecting inverter INV1 and the wire 41.

Figure 9:
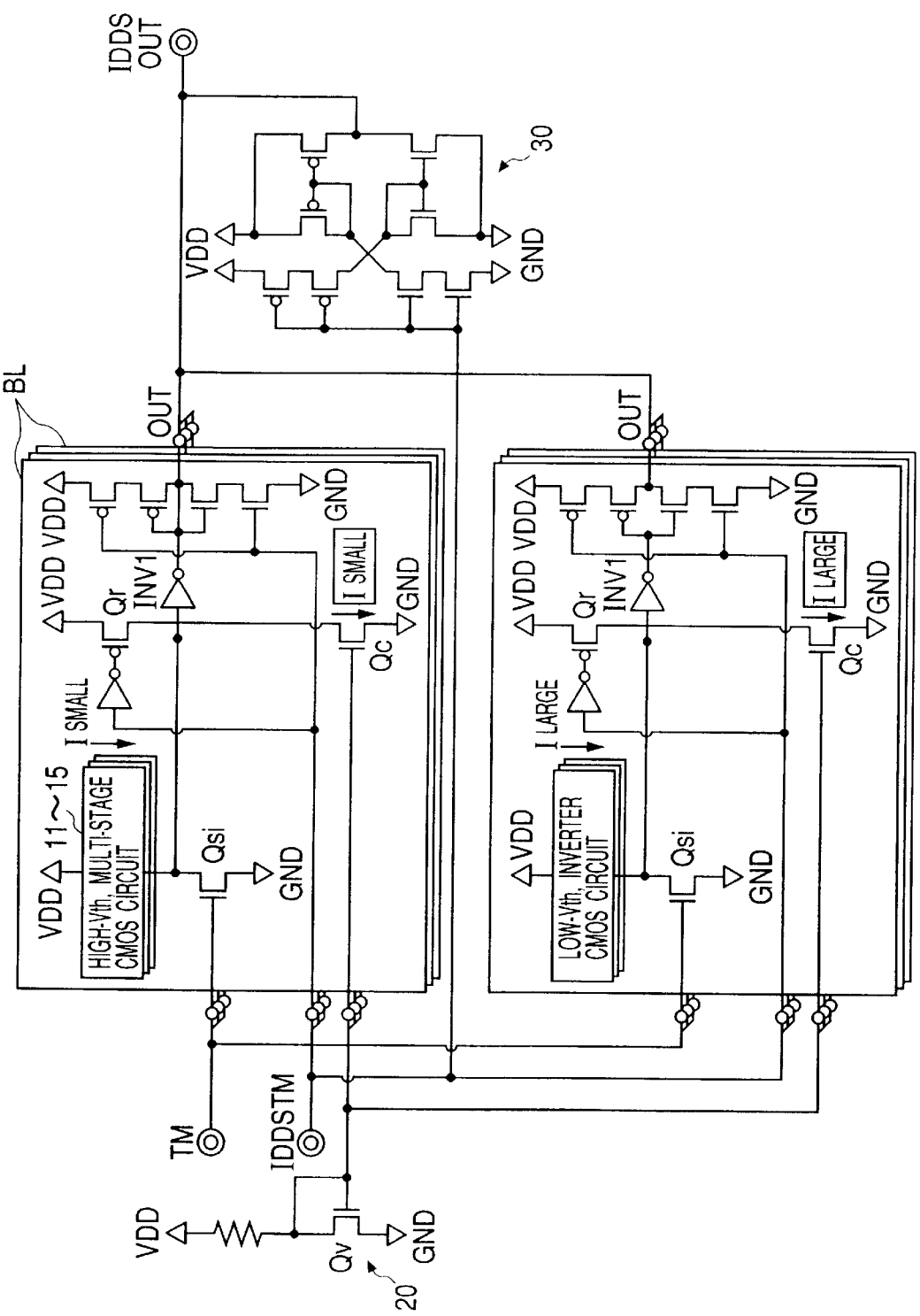
FIG. 9 is a block diagram showing a variant of the embodiment of FIG. 6.

FIG. 9 shows a variant of the embodiment of FIG. 6 with the addition of a self-check circuit which verifies the normality of the function of the leak current detecting circuit provided for each block. This embodiment is designed to optimize the current which flows through the constant current sourcing MOSFET Qc of the leak current detecting circuit provided for each functional block BL.

Figure 10A:
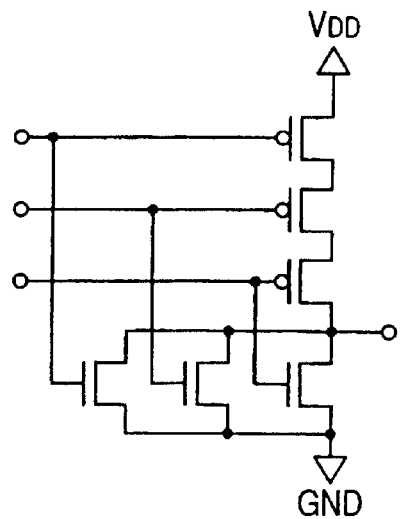
FIG. 10(A) is a schematic diagram showing an example of the circuit having a small allowable leak current.
Figure 10B:
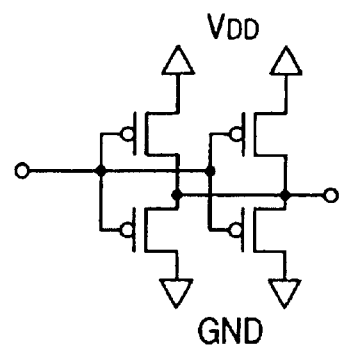
FIG. 10(B) is a schematic diagram showing an example of the circuit having a large allowable leak current.
Figure 11:
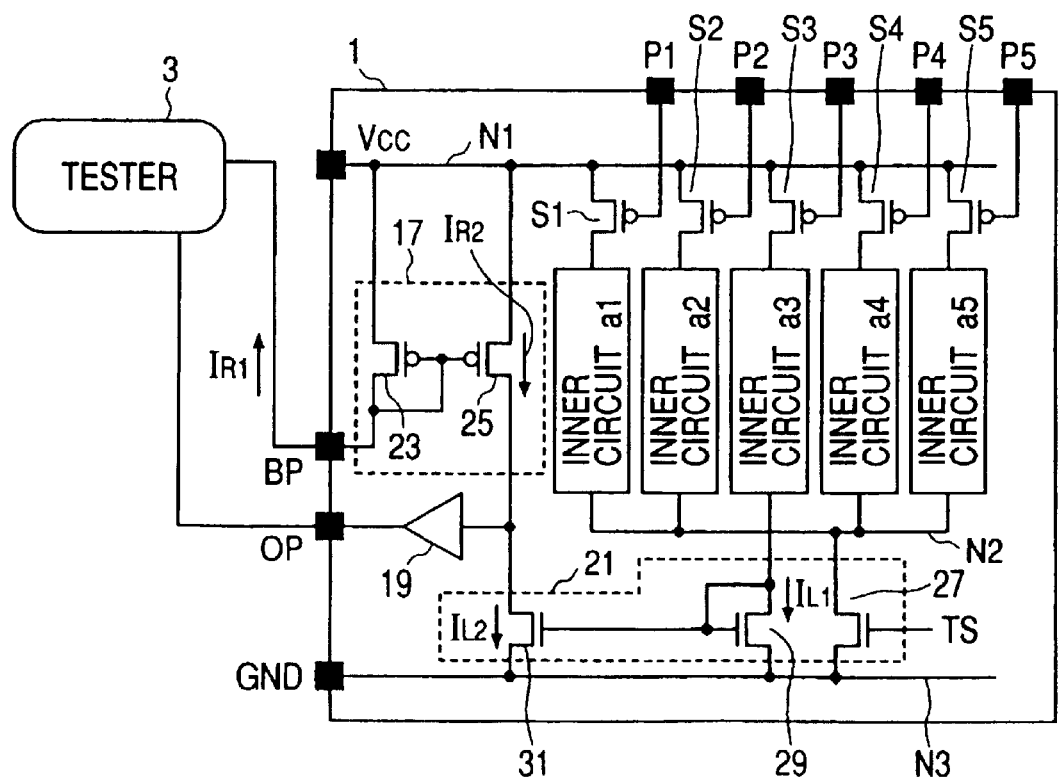
FIG. 11 is a block diagram showing an example of the conventional leak current detecting circuit.

There are two cases of CMOS-LSI, of which one is a CMOS circuit for leak current detection having a large absolute value of the threshold voltage of MOSFETs or a circuit with a small allowable leak current due to a large number of stages of tandem MOSFETs as shown in FIG. 10(A), and other is a CMOS circuit having a small absolute value of the threshold voltage of MOSFETs or a circuit with a large allowable leak current due to a small number of stages of tandem MOSFETs as shown in FIG. 10(B). The circuit of FIG. 10(A) is a 3-input NOR gate circuit, and the circuit of FIG. 10(B) is an inverter.

This embodiment is designed such that the current flowing through the constant current sourcing MOSFET Qc is made smaller for a functional block including CMOS circuits with a small allowable leak current, while the current flowing through the constant current sourcing MOSFET Qc is made larger for a functional block including CMOS circuits with a large allowable leak current. Based on this arrangement, it becomes possible to gain the leak current detection sensitivity without increasing the number of segment blocks unnecessarily.

A manner of setting a different current flowing through the constant current sourcing MOSFET Qc of each functional block is to set the ratio between the W/L (gate width to gate length) of the MOSFET Qv of the constant voltage source 20 in current-mirror connection with the constant current sourcing MOSFET Qc and the W/L of the constant current sourcing MOSFET Qc appropriately depending on the intended current value. Specifically, the W/L of constant current sourcing MOSFET Qc is made smaller for a small current of the MOSFET Qc, and it is made larger for a large current of the MOSFET Qc.

Although in the embodiment of FIG. 9, the constant voltage source 20 for supplying a bias voltage to the constant current sourcing MOSFET Qc is provided commonly to all functional blocks, an alternative arrangement is to provide a constant voltage source 20 of bias voltage for each functional block separately. In this case, it is possible to design a same constant current sourcing MOSFET Qc for all blocks and set the W/L of the MOSFET Qv of the constant voltage source 20 in current-mirror connection with the constant current sourcing MOSFET Qc variably depending on the intended current value.

Although the present invention has been explained for the specific embodiments, the invention is not confined to the foregoing embodiments, but can be altered obviously in various ways without departing from the essence of the invention. For example, the constant voltage source 20 included in the chip may be provided in the outside of the chip, with the voltage Vc to be applied to the gate terminal of the constant current sourcing MOSFET Qc of the leak current detecting circuit being supplied from the outside.

Although in the foregoing embodiment, each block current is adjusted in terms of the ratio of gate widths based on the current-mirror connection of the constant current sourcing MOSFET Qc in each block with the MOSFET Qv of the constant voltage source 20, an alternative arrangement instead of having a current-mirror circuit is to apply a different control voltage Vc to the gate terminal of the constant current sourcing MOSFET Qc in each block so that each block has an intended current value. The control voltage Vc for each block may be supplied from the outside of the chip, or may be produced within the chip based on the provision of a voltage-division resistor circuit.

Industrial Applicability

Although the present invention has been explained mainly for the case of application to CMOS-LSI which is the background utilization field of the present invention, the invention is not confined to this device, but can be used for general semiconductor integrated circuits.

What is claimed is:

1. A semiconductor integrated circuit including a plurality of blocks, each of said blocks comprising:
   a transistor;
   a CMOS circuit comprising at least one of a NOR circuit, a NAND circuit, an inverter and a latch, said CMOS circuit being directly supplied with one power voltage out of two power voltages and supplied with the other power voltage through said transistor which is brought to a non-conductive state at the detection of leakage current; and
   detecting circuit which is connected to a connection node of said CMOS circuit and said transistor and adapted to detect a leakage current flowing through said CMOS circuit.

2. A semiconductor integrated circuit according to claim 1, wherein said MOS circuit comprises a CMOS circuit.

3. A semiconductor integrated circuit according to claim 2, wherein said detecting circuit includes a current circuit which is connected between said connection node and said other power voltage and adapted to conduct a certain amount of current at the detection of leakage current, and a circuit which produces a detection signal which is derived from the voltage on said connection node.

4. A semiconductor integrated circuit according to claim 3, wherein said current circuit comprises a transistor which is brought to a conductive state at the detection of leakage current, and said detection signal producing circuit comprises a logic circuit having its input connected to said connection node.

5. A semiconductor integrated circuit according to claim 1 or 2 further including a logic circuit which receives signals from individual detecting circuits of a plurality of blocks.

6. A semiconductor integrated circuit according to claim 4 further including a logic circuit which receives detection signals from a plurality of blocks and releases a result of logical operation for the detection signals to an external terminal.

7. A semiconductor integrated circuit comprising:
- a transistor;
- a CMOS circuit comprising at least one of a NOR circuit, a NAND circuit, an inverter and a latch, said CMOS circuit being directly supplied with one power voltage out of two power voltages and supplied with the other power voltage through said transistor which is brought to a non-conductive state at the detection of leakage current; and
- a detecting circuit which is connected to a connection node of said CMOS circuit and said transistor and adapted to detect a leakage current flowing through said CMOS circuit.

8. A semiconductor integrated circuit according to claim 7, wherein said MOS circuit comprises a CMOS circuit.

9. A semiconductor integrated circuit according to claim 8, wherein said detecting circuit includes a current circuit which is connected between said connection node and said other power voltage and adapted to conduct a certain amount of current at the detection of leakage current, and a circuit which produces a detection signal which is derived from the voltage on said connection node.

10. A semiconductor integrated circuit according to claim 9, wherein said current circuit comprises a transistor which is brought to a conductive state at the detection of leakage current, and said detection signal producing circuit comprises a logic circuit having its input connected to said connection node.

11. A semiconductor integrated circuit including a plurality of blocks, each of said blocks comprising:

- a MOS circuit which is directly supplied with one power voltage out of two power voltages and supplied with the other power voltage through a transistor which is brought to a non-conductive state at the detection of leakage current; and
- a detecting circuit which is connected to a connection node of said MOS circuit and said transistor and adapted to detect a leakage current flowing through said MOS circuit, further including a logic circuit which receives signals from individual detecting circuits of a plurality of blocks.

12. A semiconductor integrated circuit according to claim 11, wherein said MOS circuit comprises a CMOS circuit.

13. A semiconductor integrated circuit including a plurality of blocks, each of said blocks comprising:

- a MOS circuit which is directly supplied with one power voltage out of two power voltages and supplied with the other power voltage through a transistor which is brought to a non-conductive state at the detection of leakage current; and
- a detecting circuit which is connected to a connection node of said MOS circuit and said transistor and adapted to detect a leakage current flowing through said MOS circuit, wherein said MOS circuit is a CMOS circuit;

wherein said detecting circuit includes a current circuit which is connected between said connection node and said other power voltage and adapted to conduct a certain amount of current at the detection of leakage current, and a circuit which produces a detection signal which is derived from the voltage on said connection node, wherein said current circuit comprises a transistor which is brought to a conductive state at the detection of leakage current, and said detection signal producing circuit comprises a logic circuit having its input connected to said connection node, and further including a logic circuit which receives detection signals from a plurality of blocks and releases a result of logical operation for the detection signals to an external terminal.

* * * * *